US012354839B2

(12) United States Patent
Ebe et al.

(10) Patent No.: US 12,354,839 B2
(45) Date of Patent: Jul. 8, 2025

(54) RADIO-FREQUENCY ANTENNA AND PLASMA PROCESSING DEVICE

(71) Applicants: EMD CORPORATION, Yasu (JP); TOMOEGAWA CORPORATION, Tokyo (JP)

(72) Inventors: Akinori Ebe, Kyoto (JP); Hajime Tsuda, Shizuoka (JP); Hideki Moriuchi, Shizuoka (JP)

(73) Assignees: EMD CORPORATION, Yasu (JP); TOMOEGAWA CORPORATION, Tokyo (JP)

( * ) Notice: Subject to any disclaimer, the term of this patent is extended or adjusted under 35 U.S.C. 154(b) by 317 days.

(21) Appl. No.: 17/232,789

(22) Filed: Apr. 16, 2021

(65) Prior Publication Data

US 2021/0327683 A1 Oct. 21, 2021

(30) Foreign Application Priority Data

Apr. 16, 2020 (JP) .................................. 2020-073436

(51) Int. Cl.
 *H01J 37/32* (2006.01)
 *H01Q 1/36* (2006.01)
(52) U.S. Cl.
 CPC ....... *H01J 37/32174* (2013.01); *H01Q 1/366* (2013.01); *H01J 2237/24564* (2013.01); *H01J 2237/3321* (2013.01)
(58) Field of Classification Search
 USPC .............. 118/715, 723, 723 R; 343/897, 701
 See application file for complete search history.

(56) References Cited

U.S. PATENT DOCUMENTS

| 6,369,763 B1* | 4/2002 | Norris .................... H01Q 1/366 |
| | | 343/873 |
| 2011/0115380 A1 | 5/2011 | Ebe et al. |

(Continued)

FOREIGN PATENT DOCUMENTS

| CN | 102027811 A | 4/2011 |
| CN | 109980348 A | 7/2019 |

(Continued)

OTHER PUBLICATIONS

English Translation KR-100803626 (Year: 2008).*

*Primary Examiner* — Yewebdar T Tadesse
(74) *Attorney, Agent, or Firm* — Oliff PLC

(57) ABSTRACT

A radio-frequency antenna through which a high amount of current can be efficiently passed even at a radio-frequency level for plasma generation, as well as a plasma processing device utilizing the radio-frequency antenna. A radio-frequency antenna includes a metal fiber sheet. A plasma processing device includes: a vacuum container including a wall having an opening; a radio-frequency antenna including a metal fiber sheet and located at the opening; and a dielectric protection plate located closer to the interior of the vacuum container than the radio-frequency antenna and configured to close the opening in a gas-tight manner. The radio-frequency antenna including a metal fiber sheet has a larger surface area and a lower impedance to a radio-frequency current than a radio-frequency antenna including a metal plate having the same outer shape. Therefore, it allows a radio-frequency current commonly used for plasma generation to be more efficiently passed through in large amounts.

17 Claims, 2 Drawing Sheets

(56) References Cited

U.S. PATENT DOCUMENTS

2013/0200043 A1* 8/2013 Tojo .................... H01J 37/3211
                                                                216/68
2014/0091982 A1    4/2014 Hansen et al.
2021/0384009 A1* 12/2021 Kawakami ............. H01L 21/31

FOREIGN PATENT DOCUMENTS

| EP | 0 261 257 A2 | 3/1988 | |
|---|---|---|---|
| EP | 2 299 789 A1 | 3/2011 | |
| JP | H08-78193 A | 3/1996 | |
| JP | 2019-009008 A | 1/2019 | |
| JP | 2019-068256 A | 4/2019 | |
| KR | 100803626 B1 * | 2/2008 | |
| TW | 201817328 A | 5/2018 | |
| WO | 2009/142016 A1 | 11/2009 | |
| WO | 2016/076523 A1 | 5/2016 | |
| WO | WO-2020023874 A1 * | 1/2020 | ............ H01J 37/321 |

\* cited by examiner

RADIO-FREQUENCY ANTENNA AND PLASMA PROCESSING DEVICE

TECHNICAL FIELD

The present invention relates to a radio-frequency antenna and a plasma processing device utilizing the radio-frequency antenna.

BACKGROUND ART

In an inductively coupled plasma processing device, generating high-density plasma within the device requires creating a strong electromagnetic field by passing a high amount of current through a radio-frequency antenna.

As an example of the radio-frequency antenna through which high current can be passed, Patent Literature 1 discloses a planar radio-frequency antenna made of a rectangular metal plate. As compared to a linear radio-frequency antenna wired in a similar planar form, the planar radio-frequency antenna has a lower impedance to a current when the current is passed between two opposite sides of the rectangle in the planar radio-frequency antenna. Thus, the antenna allows a greater amount of current to pass through.

The planar radio-frequency antenna in Patent Literature 1 is located at an opening of a vacuum container, doubling as a cover for closing the opening. The planar radio-frequency antenna is provided with a dielectric protection plate on the side facing the inner space of the vacuum container. This protection plate protects the planar radio-frequency antenna from the plasma generated within the vacuum container.

CITATION LIST

Patent Literature

Patent Literature 1: WO 2009/142016 A

SUMMARY OF INVENTION

Technical Problem

The amount of current which can be passed through a conductor increases with the cross-sectional area of the conductor across the direction in which the current is passed. However, in the case of a radio-frequency current, the current flows only in the vicinity of the surface of the conductor due to the skin effect. Therefore, increasing the cross-sectional area produces only a limited current-increasing effect.

The problem to be solved by the present invention is to provide a radio-frequency antenna through which a high amount of current can be efficiently passed even at a radio-frequency level for plasma generation, as well as a plasma processing device utilizing the radio-frequency antenna.

Solution to Problem

The radio-frequency antenna according to the present invention developed for solving the previously described problem comprises a metal fiber sheet.

The plasma processing device according to the present invention includes:
 a) a vacuum container including a wall having an opening;
 b) a radio-frequency antenna including a metal fiber sheet and located at the opening; and
 c) a dielectric protection plate located closer to the interior of the vacuum container than the radio-frequency antenna and configured to close the opening in a gas-tight manner.

In the present invention, a metal fiber sheet is used as the radio-frequency antenna. The metal fiber sheet is a sheet-shaped member composed of metal fibers. A piece of non-woven fabric in which metal fibers are randomly distributed can suitably be used as the metal fiber sheet. It is preferable that the metal fibers be at least partially bound together. The metal fiber sheet should preferably have a porous structure.

The radio-frequency antenna including a metal fiber sheet has a larger surface area and an accordingly lower impedance to a radio-frequency current than a radio-frequency antenna including a metal plate having the same outer shape to the metal fiber sheet. Therefore, it allows a radio-frequency current commonly used for plasma generation (e.g., at a frequency of 13.56 MHz) to be more efficiently passed through in large amounts.

The ratio of the volume occupied by the metal fibers to the outer-shape volume of the metal fiber sheet is called the "space factor". If the space factor is too low, the surface area becomes considerably small, allowing only a low amount of radio-frequency current to pass through. If the space factor is too high, on the other hand, the contact area between metal fibers becomes significantly large, which also makes the surface area considerably small, allowing only a low amount of radio-frequency current to pass through. It should be noted that the space factor is affected by the temperature since the individual metal fibers expand or shrink according to a change in temperature. With those points taken into account, the space factor of the metal fiber sheet used in the present invention should preferably be within a range between 5 and 60% at a temperature of 25 degrees Celsius.

In the plasma processing device according to the present invention, a dielectric protection plate is located closer to the interior of the vacuum container than the radio-frequency antenna including a metal fiber sheet. The protection plate in the present invention has the function of protecting the radio-frequency antenna from the plasma generated within the vacuum container, and also the function of closing the opening of the vacuum container in a gas-tight manner. In a conventional case, it is a radio-frequency antenna including a metal plate that has the function of closing the opening of the vacuum container in a gas-tight manner. In the present invention, since the radio-frequency antenna including a metal fiber sheet does not have gas-tight nature, the protection plate fulfils the function of closing the opening of the vacuum container in a gas-tight manner in place of the radio-frequency antenna.

It is preferable for the plasma processing device according to the present invention to further include a reinforcing plate including an insulating plate located on the opposite side of the radio-frequency antenna to the interior of the vacuum container, where a tight contact is established between the protection plate and the radio-frequency antenna as well as between the radio-frequency antenna and the reinforcing plate. According to this configuration, the protection plate, radio-frequency antenna and reinforcing plate forms an integral part, which functions as a cover for closing the opening of the vacuum container in a gas-tight manner.

Accordingly, a higher level of mechanical strength can be achieved than in the case of closing the opening with only the protection plate.

In the configuration including the reinforcing plate, it is preferable that the protection plate be thinner than the reinforcing plate. This configuration provides the entire cover with sufficient mechanical strength for closing the opening of the vacuum container, while allowing the protection plate to be thinner so as to increase the strength of the radio-frequency electromagnetic field generated from the radio-frequency antenna and penetrating to the vacuum container through the protection plate, and thereby increase plasma density.

It is preferable for the plasma processing device according to the present invention to further include a current measurement unit configured to measure the current value of a radio-frequency current injected into the radio-frequency antenna. This allows a user of the plasma processing device to monitor the current value of the radio-frequency current injected into the metal fabric sheet. This helps with the prevention of the melting of the metal fabric sheet forming the radio-frequency antenna due to an excessive amount of current flowing through the radio-frequency antenna.

In the previously configuration including the current measurement unit, it is more preferable to further include a current shut-off controller configured to shut off the radio-frequency current injected into the radio-frequency antenna when the current value measured by the current measurement unit exceeds a predetermined value. This can more assuredly prevent the melting of the metal fiber sheet.

Advantageous Effects of Invention

According to the present invention, since the radio-frequency antenna including a metal fiber sheet is used, a high amount of current can be efficiently passed through the radio-frequency antenna even at a radio-frequency level for plasma generation.

DESCRIPTION OF EMBODIMENTS

An embodiment of the plasma processing device and the radio-frequency antenna according to the present invention is hereinafter described using FIGS. 1-4.

Figure 1A:
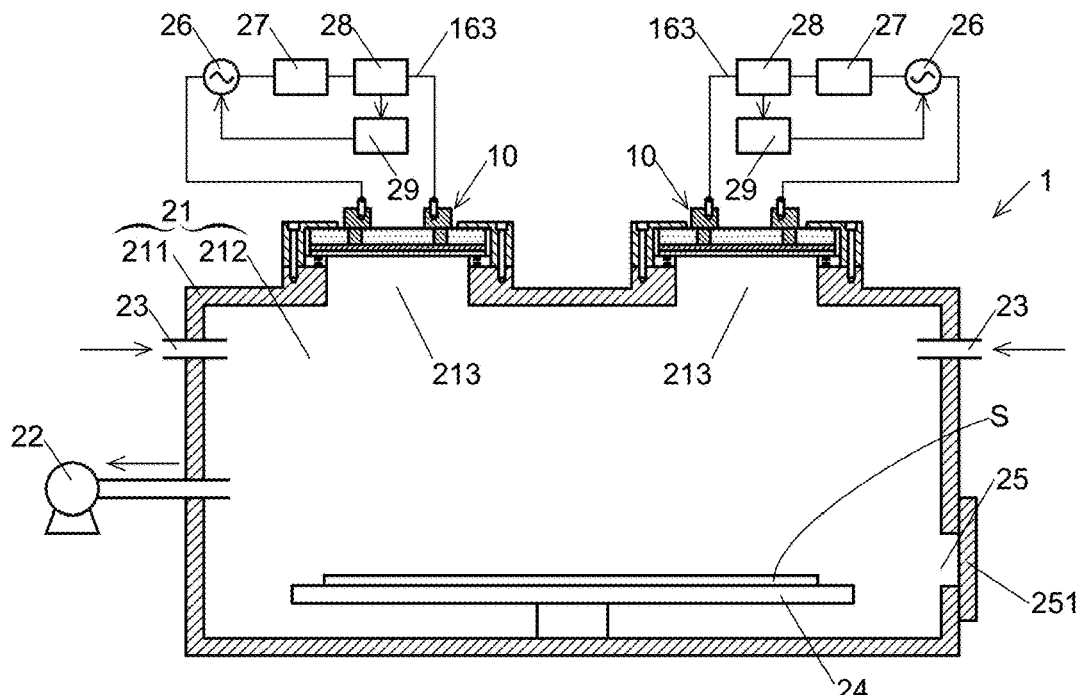
FIG. 1A is a schematic configuration diagram showing one embodiment of the plasma processing device according to the present invention.

(1) Configuration of Plasma Processing Device and Radio-Frequency Antenna According to Present Embodiment FIG. 1 is a diagram showing a schematic configuration of a plasma processing device 1 as one embodiment of the present invention. This plasma processing device 1 is a device for forming a film by plasma chemical vapor deposition (CVD). The device includes a plasma source 10, vacuum container 21, vacuum pump 22, gas supplier 23, substrate holder 24, substrate carrying-in/out opening 25, radio-frequency power source 26, impedance matching unit 27, current measurement unit 28, and current shut-off controller 29.

Initially, the components of the plasma processing device 1, except for the plasma source 10, will be described. The vacuum container 21 has a wall 211 made of metal (e.g., stainless steel). The wall 211 internally forms the inner space 212 of the vacuum container 21, within which plasma is to be generated. The vacuum pump 22 is a pump for evacuating the inner space 212. The gas supplier 23, which includes a gas cylinder (not shown) and a gas introduction tube, supplies a plasma generation gas (such as argon or hydrogen gas) and film-formation material gas for to the inner space 212. When a processing that does not use the film-formation material gas, such as the film formation by a sputtering process or the cleaning of the substrate S with the plasma, is performed on the substrate S, only the plasma generation gas is supplied from the gas suppler 23 to the inner space 212. The substrate holder 24 is configured to hold the substrate S. The substrate carrying-in/out opening 25, which is formed in the wall 211, is an opening through which the substrate S is carried in/out when the substrate S is transferred from the outside of the vacuum container 21 onto the substrate holder 24 before the film formation process, or when the substrate S is transferred from the substrate holder 24 to the outside of the vacuum container 21 after the film formation process. The substrate carrying-in/out opening 25 is hermetically closed with a lid 251 except when the substrate S is carried in/out.

The radio-frequency power source 26 is a power source configured to generate a radio-frequency current at a frequency of 13.56 MHz and supply the radio-frequency current to a radio-frequency antenna 11 (which will be described later). The impedance matching unit 27 is configured to adjust the impedance so that the radio-frequency current will be efficiently injected from the radio-frequency power source 26 into the radio-frequency antenna 11. The current measurement unit 28 is an ammeter configured to measure the current value of the radio-frequency current flowing in a power supply line 163 connected to the radio-frequency antenna 11, in order to monitor the current value of the radio-frequency current injected into the radio-frequency antenna 11. The current shut-off controller 29 is configured to control the radio-frequency power source 26 so as to shut off the radio-frequency current injected into the radio-frequency antenna 11 when the current value of the radio-frequency current measured by the current measurement unit 28 has exceeded a predetermined value.

In the present embodiment, two plasma sources 10 are provided in one plasma processing device 1. The number of plasma sources 10 is not limited to two; it may be one, three or more. Each plasma source 10 includes a radio-frequency antenna 11, protection plate 12, reinforcing plate 13, antenna fixation frame 14, gas-tightness holder 15 and two radio-frequency current supply bars 16.

In the present embodiment, a metal fiber sheet is used as the radio-frequency antenna 11. The metal fiber sheet may be any type of sheet-like object made of metal fibers. The sheet-like object made of metal fibers may be a piece of non-woven fabric in which metal fibers are randomly distributed, or it may be a piece of woven fabric or mesh made of metal fibers. The metal fiber sheet may have a porous structure. Furthermore, the metal fiber sheet may contain a component other than the metal fibers. It is preferable that the metal fibers forming the metal fiber sheet be at least partially bound together. The state in which "the metal fibers forming the metal fiber sheet is at least partially bound together" is a state in which the metal fibers are physically fixed together. The metal fibers may be directly fixed together, or indirectly via a component ("second metal component") that is different from the metal component of the metallic fibers. Among the various forms of metal fiber sheets described to this point, a piece of non-woven fabric with the metal fibers at least partially bound together is particularly preferable.

The radio-frequency antenna 11 including a metal fiber sheet formed by a large number of metal fibers has a larger surface area and an accordingly lower impedance to a radio-frequency current than a radio-frequency antenna including a metal plate having the same outer shape to the metal fiber sheet. Therefore, it allows a radio-frequency current commonly used for plasma generation (e.g., at a frequency of 13.56 MHz) to be more efficiently passed through in large amounts.

The metal component of the metal fibers, as well as the second metal component, in the metal fiber sheet used in the present embodiment are not limited to specific kinds of metal. Any kind of metal may be used for each of those metal components, such as copper, stainless steel, iron, aluminum, bronze, brass, nickel, chrome or an alloy of a plurality of kinds of metal.

The average fiber diameter of the metal fibers in the metal fiber sheet used in the present embodiment can be set as needed. A preferable range is between 1 μm and 30 μm, more preferably between 2 μm and 20 μm. The "average fiber diameter" is an average value of the area diameters of a plurality of metal fibers (e.g., 20 fibers) observed on a microscopic image showing a perpendicular section at an arbitrary site of the metal fiber sheet, where the "area diameter" of each metal fiber is determined by calculating the diameter of a circle having the same area as the sectional area of the metal fiber calculated from the imaged perpendicular section (e.g., by using a commonly known software program). The average fiber length of the metal fibers in the metal fiber sheet used in the present embodiment should preferably be within a range between 1 mm and 10 mm, more preferably between 3 mm and 6 mm. The "average fiber length" is an average of microscopically measured values of a plurality of fibers (e.g., 20 fibers). Setting the average fiber diameter and the average fiber length of the metal fibers within the aforementioned ranges makes it easy to increase the surface area of the metal fiber sheet while decreasing the impedance to the radio-frequency current.

The space factor in the metal fiber sheet used in the present embodiment should preferably be within a range between 5% and 60% at a temperature of 25 degrees Celsius. If the space factor is too low, the surface area becomes considerably small, allowing only a low amount of radio-frequency current to pass through the radio-frequency antenna 11. If the space factor is too high, on the other hand, the contact area between metal fibers becomes large, which also makes the surface area considerably small, allowing only a low amount of radio-frequency current to pass through the radio-frequency antenna 11. The space factor can be calculated from the envelope volume of the entire metal fiber sheet (including the pores) at a temperature of 25 degrees Celsius and the volumes of the metal fibers forming the metal fiber sheet. The envelope volume of the metal fiber sheet can be determined by measuring the thickness and the area of the metal fiber sheet by commonly known methods.

The thickness of the metal fiber sheet is not specifically limited. A preferable range is between 100 μm and 1 mm. Setting the thickness of the metal fiber sheet within this range makes it easier to ensure that a sufficient amount of radio-frequency current can be passed through the radio-frequency antenna. The thickness of the metal fiber sheet can be measured, for example, by Digimatic Indicator ID-C112X manufactured by Mitutoyo Corporation.

The protection plate 12 is a dielectric plate, which is in contact with one of the two face of the radio-frequency antenna 11. The reinforcing plate 13, which is a dielectric plate having a larger thickness than the protection plate 12, is in contact with the other face opposite to the aforementioned face of the radio-frequency antenna 11. Thus, the radio-frequency antenna 11 is sandwiched between the protection plate 12 and the reinforcing plate 13. In other words, the reinforcing plate 13, radio-frequency antenna 11 and protection plate 12 are sequentially stacked to form a laminated body 110. The laminated body 110 is arranged so that the protection plate 12 faces an opening 213 formed in the (upper) wall 211 of the vacuum container 21. The protection plate 12 and the reinforcing plate 13 may be made of aluminum oxide, zirconium oxide, silicon nitride, aluminum nitride or other appropriate materials. Both the protection plate 12 and the reinforcing plate 13 may be made of the same material, or each plate may be made of a different material. In the present embodiment, in order to facilitate the release of the heat emitted from the radio-frequency antenna 11 or plasma during the use of the device, both the protection plate 12 and the reinforcing plate 13 are made of aluminum nitride, which has a high level of thermal conductivity among dielectric materials.

The antenna fixation frame 14 has a frame body 141 and an extended portion 142. The frame body 141 surrounds the radio-frequency antenna 11, protection plate 12 and reinforcing plate 13 on their side surfaces. The extended portion 142 protrudes from the frame body 14 along the surface of the reinforcing plate 13 opposite to the radio-frequency antenna 11, covering a portion of the same surface. When the reinforcing plate 13 is on the upper side, the antenna fixation frame 14 has an inverted L-shape at a section perpendicular to the reinforcing plate 13. The frame body 141 has holes penetrating from top to bottom. Bolts are inserted in those holes to fix the antenna fixation frame 14 to the (upper) wall 211 of the vacuum container 21 surrounding the opening 213. The gas-tightness holder 15 is located on the upper surface of the (upper) wall 211 inside the frame body 141 in such a manner that the laminated body 110 is firmly held by being vertically clamped between the extended portion 142 and the gas-tightness holder 15. The gas-tightness holder 15 consists of a frame member 151 with a seal member (O ring) 152 in its upper surface and another seal member (O ring) 153 in its lower surface. The upper seal member 152 is pressed onto the protection plate 12, while the lower seal member 153 is pressed onto the (upper) wall 211.

The previously described configuration establishes a tight contact between the radio-frequency antenna 11 and the protection plate 12 as well as between the radio-frequency antenna 11 and the reinforcing plate 13, to form the laminate body 110 as one integral part, which functions as a cover for closing the opening 213 in a gas-tight manner. The radio-frequency antenna 11 is separated from the inner space 212 of the vacuum container 21 by the protection plate 12 and is thereby protected from the plasma generated within the inner space 212.

The reinforcing plate 13 has two linearly elongated rectangular hollows extending approximately parallel to each other. A radio-frequency current supply bar 16 including a rectangular metal bar is fitted in each of those hollows. On the upper surface of each radio-frequency current supply bar 16, a metallic power supply block 161 is fixed to the radio-frequency current supply bar 16 with bolts. This block is in contact with the entire upper surface of the radio-frequency current supply bar 16, extending beyond both sides the upper surface of the same bar to the upper surface of the reinforcing plate 13. Each power supply block 161 is fitted with a power supply terminal 162. A power supply line 163 is connected to each power supply terminal 162. One of the power supply lines 163 is connected to one of the terminals of the radio-frequency power source 26, while the other power supply line 163 is connected to the other terminal of the radio-frequency power source 26 via the impedance matching unit 27. Each radio-frequency current supply bar 16 is 30 mm in length. The distance between the two radio-frequency current supply bars 16 is 150 mm.

In order to strengthen the radio-frequency electromagnetic field generated within the inner space 212 of the vacuum container 21, the protection plate 12 should preferably be thin. On the other hand, the reinforcing plate 13 should preferably be thick so as to withstand the force which acts on the laminated body 110 due to the pressure difference between the vacuum atmosphere within the inner space 212 of the vacuum container 21 which the protection plate 12 faces and the ambient air which the reinforcing plate 13 is in contact with. However, using an extremely thick reinforcing plate 13 impedes the release of the heat emitted from the radio-frequency antenna 11. Furthermore, the required mechanical strength depends on the size of the opening 213 of the vacuum container 21. Those points should be taken into account in determining the thicknesses of the protection plate 12 and the reinforcing plate 13. In the present embodiment, the opening 213 has a rectangular shape with the longer sides measuring 210 mm and the shorter sides measuring 160 mm. The protection plate 12 is 3 mm in thickness, while the reinforcing plate 13 is 20 mm in thickness. Needless to say, their thicknesses may be changed as needed. For example, the thickness of the protection plate 12 may be within a range between 1 and 5 mm, while that of the reinforcing plate 13 may be within a range between 5 and 30 mm. The thicknesses of the protection plate 12 and the reinforcing plate 13 may even be selected outside the previously mentioned ranges.

(2) Operation of Plasma Processing According to Present Embodiment

An operation of the plasma processing device according to the present embodiment is hereinafter described. Initially, the cover 251 of the substrate carrying-in/out opening 25 is opened, and substrate S is carried into the inner space 212 of the vacuum container 21. The substrate S is placed on and held by the substrate holder 24. The cover 251 is subsequently closed, and the inner space 212 of the vacuum container 21 is evacuated by the vacuum pump 22. The plasma generation gas and the film-formation material gas are supplied from the gas supplier 23 to the inner space 212. A radio-frequency current is injected from the radio-frequency power source 26 into the radio-frequency antenna 11 through the impedance matching unit 27, power supply line 163, power supply terminal 162, power supply block 161 and radio-frequency current supply bar 16. The radio-frequency current thus injected into the radio-frequency antenna 11 generates a radio-frequency electromagnetic field within the inner space 212, whereby the molecules of the plasma generation gas are ionized, forming a cloud of plasma. This plasma breaks the molecules of the film-formation material gas into smaller particles, which are deposited on the substrate S and form a film.

Figure 2:
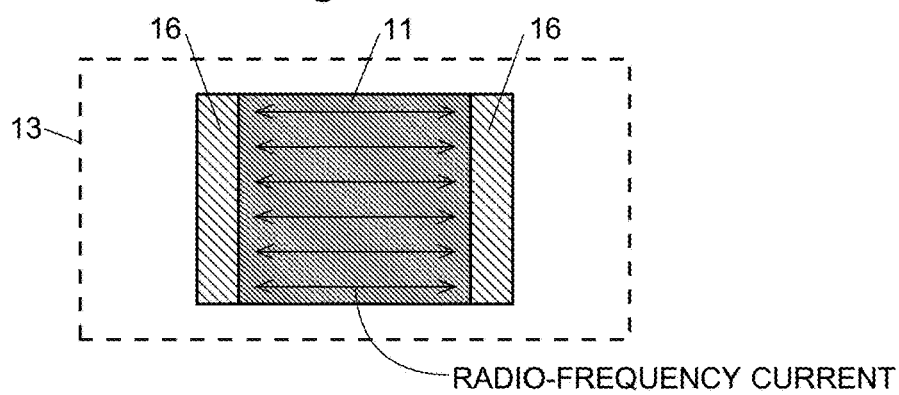
FIG. 2 is a diagram showing the radio-frequency antenna in the plasma processing device according to the present embodiment, with the arrows indicating the flow of the radio-frequency current in the entire antenna.

In an overall view of the radio-frequency antenna 11, the radio-frequency current flows in a two-dimensionally spread form, as indicated by the arrows in FIG. 2, between the two radio-frequency current supply bars 16 arranged parallel to each other. When a portion of the radio-frequency antenna 11 is specifically viewed, the radio-frequency current flows in the surface layer of the individual metal fibers forming the radio-frequency antenna 11.

In the plasma processing device 1 according to the present embodiment, since the radio-frequency antenna 11 including a metal fiber sheet is used, the surface area of the metallic body (metal fibers) through which the radio-frequency current passes is larger than in the case of a metal plate having the same planar shape (i.e., which extends in flat without a bent portion) as the metal fiber sheet, so that the radio-frequency current can be more efficiently passed though in large amounts. Therefore, the strength of the radio-frequency electromagnetic field injected into the inner space 212 of the vacuum container 21 can be increased, and the density of the plasma generated within the inner space 212 can be increased.

An experiment was performed to measure the electron density of the plasma generated within the inner space 212 of the plasma processing device 1 according to the present embodiment. Its result will be described later. In the experiment, a metal fiber sheet having a space factor of 13% was used as the radio-frequency antenna 11. The metal fiber sheet was prepared by forming copper fibers with an average fiber length of 3 mm and average fiber diameter of 9 μm by a wet sheet-making method, drying those fibers, and binding the copper fibers together in an ambiance of inert gas. As a comparative example, a similar experiment was performed using a conventional radio-frequency antenna including a metal plate having the same planar shape as the radio-frequency antenna 11. The number of radio-frequency antennas was one in both the present embodiment and the comparative example. Nitrogen gas as the plasma generation gas was introduced into the inner space 212 of the vacuum container 21 to establish a state with a pressure of 1.0 Pa and a flow rate of 100 sccm. Under these conditions, the radio-frequency power within a range between 100 and 1000 W was injected into the radio-frequency antenna, and the electron density of the plasma at a distance of 120 mm from the antenna was measured with a Langmuir probe.

Figure 3:
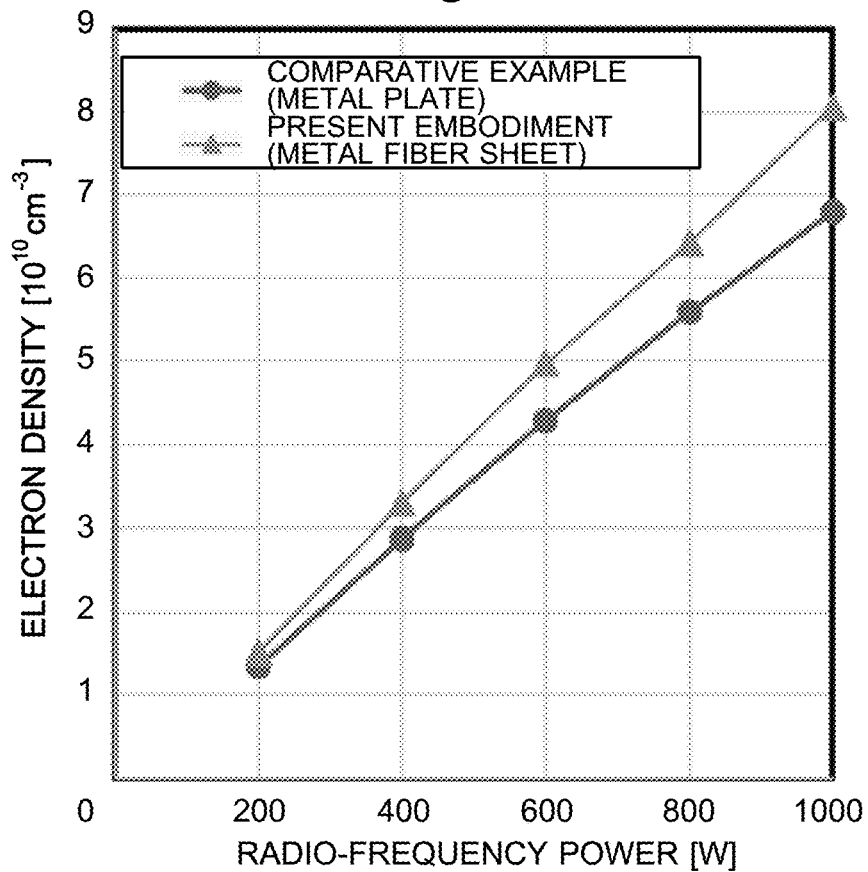
FIG. 3 is a graph showing the electron density of the plasma generated in the plasma processing device according to the present embodiment as well as that of the plasma generated in a plasma processing device using a conventional antenna including a metal plate.

The result of the experiment is shown in FIG. 3. The electron density increased in proportion to the magnitude of the radio-frequency power in both the present embodiment and the comparative example. A comparison of the present embodiment and the comparative example at the same value of the radio-frequency power demonstrates that the electron density in the present embodiment was roughly 15-20% higher than in the comparative example over the entire range of the radio-frequency power within which the measurement was performed. A likely reason for this is that the radio-frequency antenna 11 in the present embodiment has a lower inductance since the radio-frequency current flows in the surface layer of the individual metal fibers, whereby the amount of radio-frequency current is increased, and the strength of the radio-frequency electromagnetic field within the inner space 212 of the vacuum container 21 is increased.

As described to this point, the plasma processing device 1 according to the present embodiment produces the effect of the present invention, which is to say that the use of the radio-frequency antenna 11 including a metal fiber sheet increases the surface area for the flow of the radio-frequency current and thereby allows a high amount of current to be efficiently passed through the radio-frequency antenna. The same device also produces the following additional effects.

In the plasma processing device 1 according to the present embodiment, the reinforcing plate 13 is used in addition to the radio-frequency antenna 11 and the protection plate 12. A tight contact is established between the radio-frequency antenna 11 and the protection plate 12 as well as between the radio-frequency antenna 11 and the reinforcing plate 13, to form an integral part and thereby increase the mechanical strength of the cover which closes the opening 213 in a gas-tight manner. This allows the protection plate 12 to have a lower level of strength than in the case where the reinforcing plate 13 is not present. Accordingly, a thin protection plate 12 (which, for example, is thinner than the reinforcing plate 13) can be used, which increases the strength of the radio-frequency electromagnetic field generated by the radio-frequency antenna 11 and penetrating to the inner space 212 of the vacuum container 21 through the protection plate 12.

In general, when a planar radio-frequency antenna is in tight contact with a protection plate, friction occurs between the radio-frequency antenna and the protection plate since the metallic radio-frequency antenna shows a greater amount of thermal expansion with an increase in temperature and a greater amount of thermal shrinkage with a decrease in temperature than the dielectric protection plate. This leads to the problem of the abrasion of the radio-frequency antenna and/or protection plate. By comparison, in the case of the plasma processing device 1 according to the present embodiment, since the radio-frequency antenna 11 includes a metal fiber sheet, an increase in temperature causes the individual metal fibers to expand, narrowing down the interspaces between the fibers, while a decrease in temperature causes the individual metal fibers to shrink, expanding the interspaces between the fibers. Therefore, the amount of thermal expansion/shrinkage of the entire radio-frequency antenna 11 becomes smaller than that of the conventional radio-frequency antenna including a metal plate. Thus, as compared to the conventional radio-frequency antenna including a metal plate, the radio-frequency antenna 11 including a metal fiber sheet shows a smaller difference from the protection plate 12 in terms of the amount of thermal expansion/shrinkage. This reduces the friction between the radio-frequency antenna 11 and the protection plate 12. Thus, the abrasion of the radio-frequency antenna 11 and/or the protection plate 12 due to the friction can be suppressed.

In the plasma processing device 1 according to the present embodiment, the current value of the radio-frequency voltage flowing through the radio-frequency antenna 11 is measured by the current measurement unit 28, and the radio-frequency power source 26 is controlled by the current shut-off controller 29 to discontinue the supply of the radio-frequency current to the radio-frequency antenna 11 when the current value has exceeded a predetermined value. Thus, the radio-frequency antenna 11 is prevented from being melted due to an excessive amount of current passing through the radio-frequency antenna 11.

(3) Modified Examples

The present invention is not limited to the previous embodiments. It can be modified in various forms.

Figure 4:
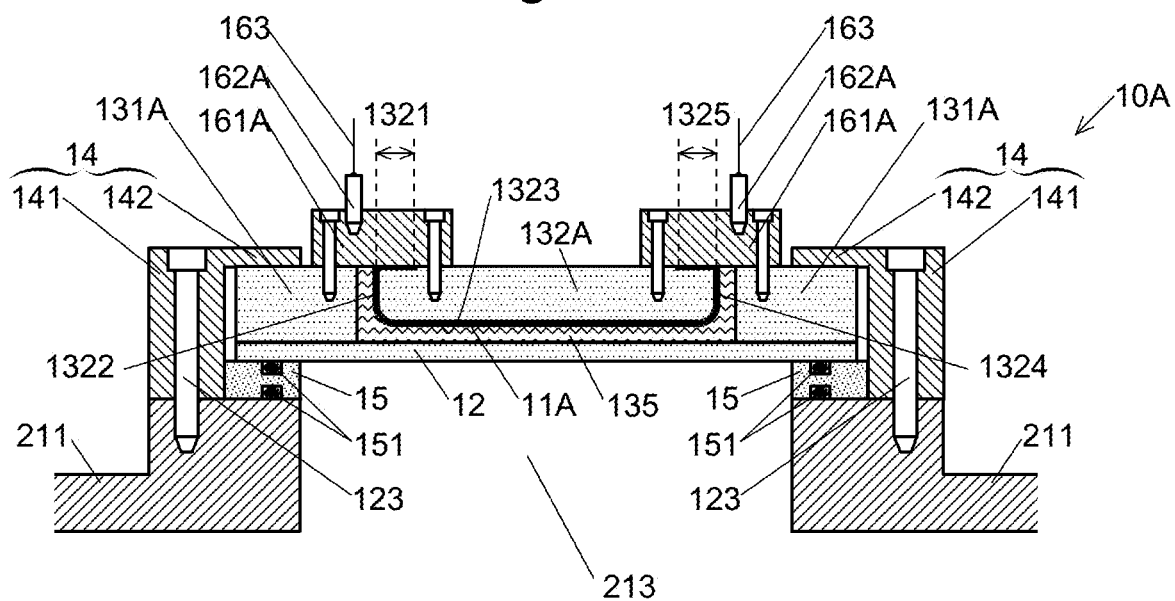
FIG. 4 is a schematic configuration diagram showing a modified example of a plasma source according to the present invention.

For example, in the plasma processing device 1 according to the present invention, a plasma source 10A as shown in FIG. 4 may be used in place of the previously described plasma source 10. The plasma source 10A includes a radio-frequency antenna 11A, protection plate 12, first reinforcing plate 131A, second reinforcing plate 132A, antenna fixation frame 14, gas-tightness holder 15 and two power supply blocks 161A. The configurations of the protection plate 12 and the gas-tightness holder 15 are identical to those in the previous embodiment. Therefore, the descriptions of these components will be omitted.

Figure 1B:
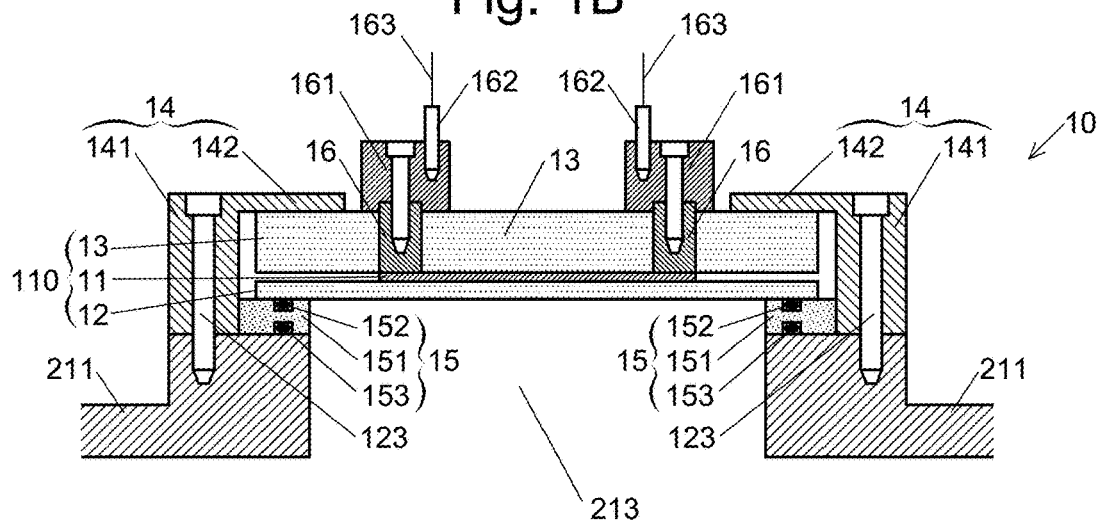
FIG. 1B is a partially enlarged view of an area including the radio-frequency antenna.

The first reinforcing plate 131A has a frame-like shape formed by removing a central area of an insulating plate. The second reinforcing plate 132A is fitted in that frame. The radio-frequency antenna 11A includes a metal fiber sheet similar to the one described in the previous embodiment, but its form of the attachment to the plasma source 10A is different from the previous embodiment. Specifically, whereas the radio-frequency antenna 11 of the previous embodiment, as shown in FIG. 1B, extends in flat, or in other words, extends without a bent portion, the radio-frequency antenna 11A, as shown in the embodiment of FIG. 4, is designed to wrap the second reinforcing plate 132A, covering a range from a partial area 1321 of the upper surface adjoining to one side surface 1322 of the second reinforcing plate 132A, via the side surface 1322, bottom surface 1323 and side surface 1324, to a partial area 1325 of the upper surface adjoining to the side surface 1324 opposite to the previously mentioned side surface 1322. Due to the flexibility of the metal fiber sheet, the radio-frequency antenna 11A can be wrapped around the second reinforcing plate 132A in this manner.

The power supply block 161A is placed on each of the areas 1321 and 1325. Each power supply block 161A is fixed to the second reinforcing plate 132A with a plurality of bolts. The bolted power supply blocks 161A presses the radio-frequency antenna 11A onto the second reinforcing plate 132A, whereby the radio-frequency antenna 11A is fixed to the second reinforcing plate 132A. Each power supply block 161A is fitted with a power supply terminal 162A. A power supply line 163 is connected to each power supply terminal 162A. As in the previous embodiment, one of the power supply lines 163 is connected to one of the terminals of the radio-frequency power source 26, while the other power supply line 163 is connected to the other terminal of the radio-frequency power source 26 via the impedance matching unit 27.

A gap is formed between the first reinforcing plate 131A and the radio-frequency antenna 11A as well as between the radio-frequency antenna 11A and the protection plate. This gap is filled with an adhesive 135 made from silicone grease, which is a dielectric resin material. The adhesive 135 improves the thermal contact between the first reinforcing plate 131A and the radio-frequency antenna 11A as well as between the radio-frequency antenna 11A and the protection plate, thereby facilitating the release of the heat emitted from the radio-frequency antenna 11A or accompanying the plasma generation to the outside of the plasma processing device.

The operation of the plasma source 10A and the plasma processing device including the plasma source 10A is similar to that of the plasma source 10 and the plasma processing device 1 according to the previous embodiment.

The present invention can be further modified. For example, the reinforcing plate 13 provided in the plasma processing device 1 according to the previous embodiment may be omitted. In that case, a member that has sufficient mechanical strength to withstand the pressure difference between the interior of the vacuum container and the outside area should be used as the protection plate 12.

Although the current measurement unit 28 and the current shut-off controller 29 are used in the plasma processing device 1 according to the previous embodiment, the current shut-off controller 29 may be omitted, leaving only the current measurement unit 28. As long as the plasma processing is performed under fixed conditions, a roughly equal amount of current should flow through the radio-frequency antenna 11. Therefore, when only the current measurement unit 28 is provided in the plasma processing device, the current measurement unit 28 can be used in a preliminary experiment for determining the plasma processing conditions in such a manner that the user watches the current value measured with the current measurement unit 28 during the preliminary experiment until those conditions are determined (after that, there is no need to monitor the current value). It is also possible to omit both the current measurement unit 28 and the current shut-off controller 29.

REFERENCE SIGNS LIST

1 . . . Plasma Processing Device
10, 10A . . . Plasma Source
11, 11A . . . Radio-Frequency Antenna
110 . . . Laminated Body
12 . . . Protection Plate
13 . . . Reinforcing Plate
131A . . . First Reinforcing Plate
132A . . . Second Reinforcing Plate
1321, 1325 . . . Area on Upper Surface of Second Reinforcing Plate
1322, 1324 . . . Side Surface of Second Reinforcing Plate
1323 . . . Bottom Surface of Second Reinforcing Plate
135 . . . Adhesive
14 . . . Antenna Fixation Frame
141 . . . Frame Body of Antenna Fixation Frame
142 . . . Extended Portion of Antenna Fixation Frame
15 . . . Gas-Tightness Holder
151 . . . Frame Member of Gas-Tightness Holder
152 . . . Seal Member
16 . . . Radio-Frequency Current Supply Bar
161, 161A . . . Power Supply Block
162, 162A . . . Power Supply Terminal
163 . . . Power Supply Line
21 . . . Vacuum Container
211 . . . Wall of Vacuum Container
212 . . . Inner Space of Vacuum Container
213 . . . Opening in Wall of Vacuum Container
22 . . . Vacuum Pump
23 . . . Gas Supplier
24 . . . Substrate Holder
25 . . . Substrate Carrying-In/Out Opening
251 . . . Cover for Substrate Carrying-In/Out Opening
26 . . . Radio-Frequency Power Source
27 . . . Impedance Matching Unit
28 . . . Current Measurement Unit
29 . . . Current Shut-Off Controller
S . . . Substrate

The invention claimed is:

1. A radio-frequency antenna configured to generate a radio-frequency electromagnetic field in a vacuum container of a plasma processing device, the radio-frequency antenna comprising:
a sheet made of fibers consisting of metal, the sheet being connected to a radio-frequency power source that supplies a radio-frequency current for generating the radio-frequency electromagnetic field.

2. The radio-frequency antenna according to claim 1, wherein the fibers are at least partially bound together.

3. The radio-frequency antenna according to claim 1, wherein a space factor of the fibers in the sheet is within a range between 5% and 60% at a temperature of 25 degrees Celsius.

4. The radio-frequency antenna according to claim 1, wherein
the sheet has a porous structure including interspaces between the fibers, and
the fibers expand to narrow down the interspaces in response to an increase in temperature and shrink to expand the interspaces in response to a decrease in temperature.

5. The radio-frequency antenna according to claim 1, wherein the sheet has a surface on which two radio-frequency current supply bars are arranged parallel to each other.

6. The radio-frequency antenna according to claim 1, wherein the sheet is rectangular and wholly extends in flat.

7. A plasma processing device, comprising:
a vacuum container including a wall having an opening;
a sheet located at the opening, the sheet acting as a radio-frequency antenna and the sheet being made of fibers consisting of metal; and
a dielectric protection plate located closer to an interior of the vacuum container than the sheet, the dielectric protection plate being configured to close the opening in a gas-tight manner,
wherein the sheet wholly extends in flat.

8. The plasma processing device according to claim 7, further comprising:
a reinforcing plate including an insulating plate located on an opposite side of the sheet to the interior of the vacuum container,
wherein a tight contact is established between the dielectric protection plate and the sheet and is established between the sheet and the reinforcing plate.

9. The plasma processing device according to claim 8, wherein the dielectric protection plate is thinner than the reinforcing plate.

10. The plasma processing device according to claim 7, further comprising:
a current measurement unit configured to measure a current value of a radio-frequency current injected into the radio-frequency antenna.

11. The plasma processing device according to claim 10, further comprising:
a current shut-off controller configured to shut off the radio-frequency current injected into the radio-frequency antenna when the current value measured by the current measurement unit exceeds a predetermined value.

12. The plasma processing device according to claim 7, wherein the fibers are at least partially bound together.

13. The plasma processing device according to claim 7, wherein a space factor of the fibers in the sheet is within a range between 5% and 60% at a temperature of 25 degrees Celsius.

14. The plasma processing device according to claim 7, wherein the sheet is rectangular.

15. The plasma processing device according to claim 14, wherein the sheet has a surface on which two radio-frequency current supply bars are arranged parallel to each other.

16. The plasma processing device according to claim 14, wherein
- the sheet has a porous structure including interspaces between the fibers, and
- the fibers expand to narrow down the interspaces in response to an increase in temperature and shrink to expand the interspaces in response to a decrease in temperature.

17. The plasma processing device according to claim 14, wherein
- the radio-frequency antenna generates a radio-frequency electromagnetic field in the vacuum container, and
- the sheet is connected to a radio-frequency power source that supplies a radio-frequency current for generating the radio-frequency electromagnetic field.

\* \* \* \* \*